United States Patent
Kanno

(10) Patent No.: US 6,340,911 B1
(45) Date of Patent: Jan. 22, 2002

(54) LEVEL CONVERSION CIRCUIT HAVING DIFFERENTIAL CIRCUIT EMPLOYING MOSFET

(75) Inventor: Hiroshi Kanno, Tokyo (JP)

(73) Assignee: NEC Corporation, Tokyo (JP)

( * ) Notice: Subject to any disclaimer, the term of this patent is extended or adjusted under 35 U.S.C. 154(b) by 517 days.

(21) Appl. No.: 08/784,775

(22) Filed: Jan. 16, 1997

(30) Foreign Application Priority Data

Jan. 17, 1996 (JP) .............................. 8-005905

(51) Int. Cl.[7] ........................................... H03K 19/017
(52) U.S. Cl. ........................ 327/333; 327/306; 326/68
(58) Field of Search .......................... 327/77, 333, 530, 327/581, 437, 306; 326/62, 63, 68

(56) References Cited

U.S. PATENT DOCUMENTS

| 4,779,016 A | | 10/1988 | Sugiyama et al. ............. 326/66 |
| 5,304,870 A | * | 4/1994 | Nagasawa .................... 327/333 |
| 5,332,935 A | | 7/1994 | Shyu ............................. 326/71 |
| 5,434,516 A | | 7/1995 | Sinh et al. .................... 326/66 |

FOREIGN PATENT DOCUMENTS

| EP | 0436823 | | 7/1991 | |
| JP | 363313915 | * | 12/1988 | .................. 326/63 |
| JP | 5160709 | | 6/1993 | |

* cited by examiner

Primary Examiner—Dinh T. Le
(74) Attorney, Agent, or Firm—Sughrue Mion, PLLC

(57) ABSTRACT

Disclosed herein is a level conversion circuit which operates at high speeds even at a low power-supply voltage. The level conversion circuit is largely constituted by an emitter follower section 101, an amplitude amplification section 102, and a level conversion section 103. The amplitude amplification section 102 is a differential amplifier constructed so that the gate of an N-channel MOS transistor M1 is connected to a node 001, the connection node 002 of the drain is connected to a high power-supply terminal VCC through a resistor R2, the source is connected to a node 004, the base of an N-channel MOS transistor M2 is connected to a reference power-supply terminal VR, the connection node 003 of the drain is connected to the high power-supply terminal VCC through a resistor R3, the source is connected to a node 004, the base of an NPN transistor Q4 is connected to a reference power-supply terminal VCSI, the collector is connected to the node 004, and the emitter is connected to the first low power-supply terminal GND1 through a resistor R4.

6 Claims, 2 Drawing Sheets

LEVEL CONVERSION CIRCUIT HAVING DIFFERENTIAL CIRCUIT EMPLOYING MOSFET

BACKGROUND OF THE INVENTION

1. Field of the Invention

The present invention relates to a level conversion circuit and, more particularly, to such a circuit that converts an ECL level or CML level signal to a MOS level signal.

2. Description of the Related Art

As a signal input circuit of a MOS-IC or MOS-LSI, a level conversion circuit is widely employed to convert an input signal having an ECL level or a CML level signal to into an internal signal having a MOS level signal. Such a circuit generally employs a differential circuit composed of bipolar transistors.

Specifically, as shown in FIG. 2, a conventional level conversion circuit includes an emitter follower section 101, an amplitude amplification section 102, and a level conversion section 103. The emitter follower section 101 is an emitter follower constructed such that the base of an NPN transistor Q1 is connected to an input terminal IN, the collector is connected to a high power-supply terminal VCC, and the connection node 001 of the emitter is connected to a first low power-supply terminal GND1 through a resistor R1.

The amplitude amplification section 102 is a differential amplifier constructed such that the base of an NPN transistor Q2 is connected to the node 001, the connection node 002 of the collector is connected to the high power-supply terminal VCC through a resistor R2, and the emitter is connected to a node 004. The base of an NPN transistor Q3 is connected to a reference power-supply terminal VR, the connection node 003 of the collector is connected to the high power-supply terminal VCC through a resistor R3, and the emitter is connected to a node 004. The base of an NPN transistor Q4 is connected to a reference power-supply terminal VCSI, the collector is connected to the node 004, and the emitter is connected to the first low power-supply terminal GND1 through a resistor R4.

The level conversion section 103 is a level conversion section constructed such that the gate of a P-channel MOS transistor P1 is connected to the node 003, the source is connected to the high power-supply terminal VCC, and the drain is connected to a node 006. The gate of a P-channel MOS transistor P2 is connected to the node 002, the source is connected to the high power-supply terminal VCC, and the drain is connected to an output terminal OUT. The gate and drain of an N-channel MOS transistor N1 are connected to a node 006, and the source is connected to a second low power-supply terminal GND2. The gate of an N-channel MOS transistor N2 is connected to the node 006, the source is connected to the second low power-supply terminal GND2, and the drain is connected to the output terminal OUT.

In operation, when the high level of the same current mode logic (CML) level as the high power-supply potential is input to the input terminal IN, the level of the signal is shifted by the amount of the ON-state base-emitter voltage of the NPN transistor by the emitter follower section 101. The shifted signal is input to the node 001 which is the input of the amplitude amplification section 102, and the NPN transistor Q2 is turned on. The NPN transistor Q3 is turned off and current flows through the resistor R2. A level lower by the amount of the voltage drop of the resistor than the high power-supply potential is output to the node 002, and the high power-supply potential is output to the node 003. These levels are input to the level conversion section 103. The P-channel MOS transistor P2 is turned on and the P-channel MOS transistor P1 is turned off. The electric charges on the node 006 are pulled out by the N-channel MOS transistor N1, and the N-channel MOS transistor N2 is turned off. The high level of the same CMOS level as the high power-supply potential is output to the output terminal OUT.

When the low level of the CML level lower by the amount of a logic amplitude than the high power-supply potential is input to the input terminal IN, the low level of the same CMOS level as the second low power-supply potential is output to the output terminal OUT.

In this conventional level conversion circuit, the levels on the nodes 002 and 003, which are the outputs of the amplitude amplification section 102, have to be sufficiently low in order to completely turn on one transistor of the P-channel MOS transistors P1 and P2 of the input section of the level conversion section 103 and completely turn off the other transistor. If this requirement is not met, the level conversion section will not be operated, or even if it were operated, the operating speed would become slow.

The low level on the output of the amplitude amplification section 102 must be a sufficiently low level so that one transistor of the input transistors of the level conversion section 103 can be completely turned on even when the value fluctuates and becomes the highest value. However, if the low level of the output is set to a sufficiently low value in view of the case where it is the maximum value, there will be the problem that the collector potentials of the NPN transistors Q2 and Q3, which constitute the current switches of the amplitude amplification section 102, will be overreduced and that the transistors will be saturated and the operating speeds will be reduced, when the low level of the output fluctuates conversely in the lowest direction.

In order to avoid the saturation of the NPN transistors Q2 and Q3 at the current switch section of the amplitude amplification section 102, there is a method where a diode is inserted between the emitter of the NPN transistor Q1 and the node 001 so that the input signal level to a transistor constituting the current switch section is further reduced by the amount of the ON-state base-emitter voltage of the transistor. When the first low power-supply terminal GND2 is sufficiently low and the potential on the reference power-supply terminal VCSI is also low, there is no problem. However, when the first power-supply potential GND1 is high and becomes equal to the potential of the second low power-supply terminal GND2 and when the power-supply voltage, which is the potential difference between the high power-supply potential and the low power-supply potential, is low, there arises the problem that the collector potential of the NPN transistor Q4 constituting a current source falls and that the NPN transistor Q4 is saturated, if an input signal level is lowered.

Making the low level on the output of the amplitude amplification section 102 sufficiently large so that the MOS transistors P1 and P2 of the level conversion section 103 can be completely turned on or off and also preventing the saturation of the transistors of the current switch and current source sections become even more severe as the power-supply voltage becomes lower.

SUMMARY OF THEE INVENTION

Accordingly, it is an object of the present invention to provide a level conversion circuit which operates at high speeds even at a low power-supply voltage.

A level conversion circuit according to the present invention includes an emitter follower section for receiving an ECL or a CML level signal and outputting a level-shifted signal, a differential amplitude amplification section provided with a pair of MOS transistors of one channel type, their sources being connected in common and also being connected to a first low power-supply terminal through a current source, an output of said emitter follower section being input to the gate of one transistor of the pair of MOS transistor, a complementary signal of the output of the emitter follower section or an input reference voltage being input to the gate of the other transistor, and their drains being connected to a high power-supply terminal through road devices, respectively and outputting differentially. The circuit further includes a level conversion section provided with a current mirror circuit which comprises a pair of MOS transistors of an opposite channel type, where their sources are connected to the high power-supply terminal and their gates receive a differential output of the amplitude amplification section and a pair of MOS transistors of the one channel type having their drains respectively connected to the drains of the MOS transistors, sources connected to a second low power-supply terminal, and gates connected in common and also connected to one drain thereof.

BRIEF DESCRIPTION OF THE DRAWINGS

The present invention will be described in further detail with reference to the accompanying drawings, in which.

DETAILED DESCRIPTION OF THE PREFERRED EMBODIMENT

Figure 1:
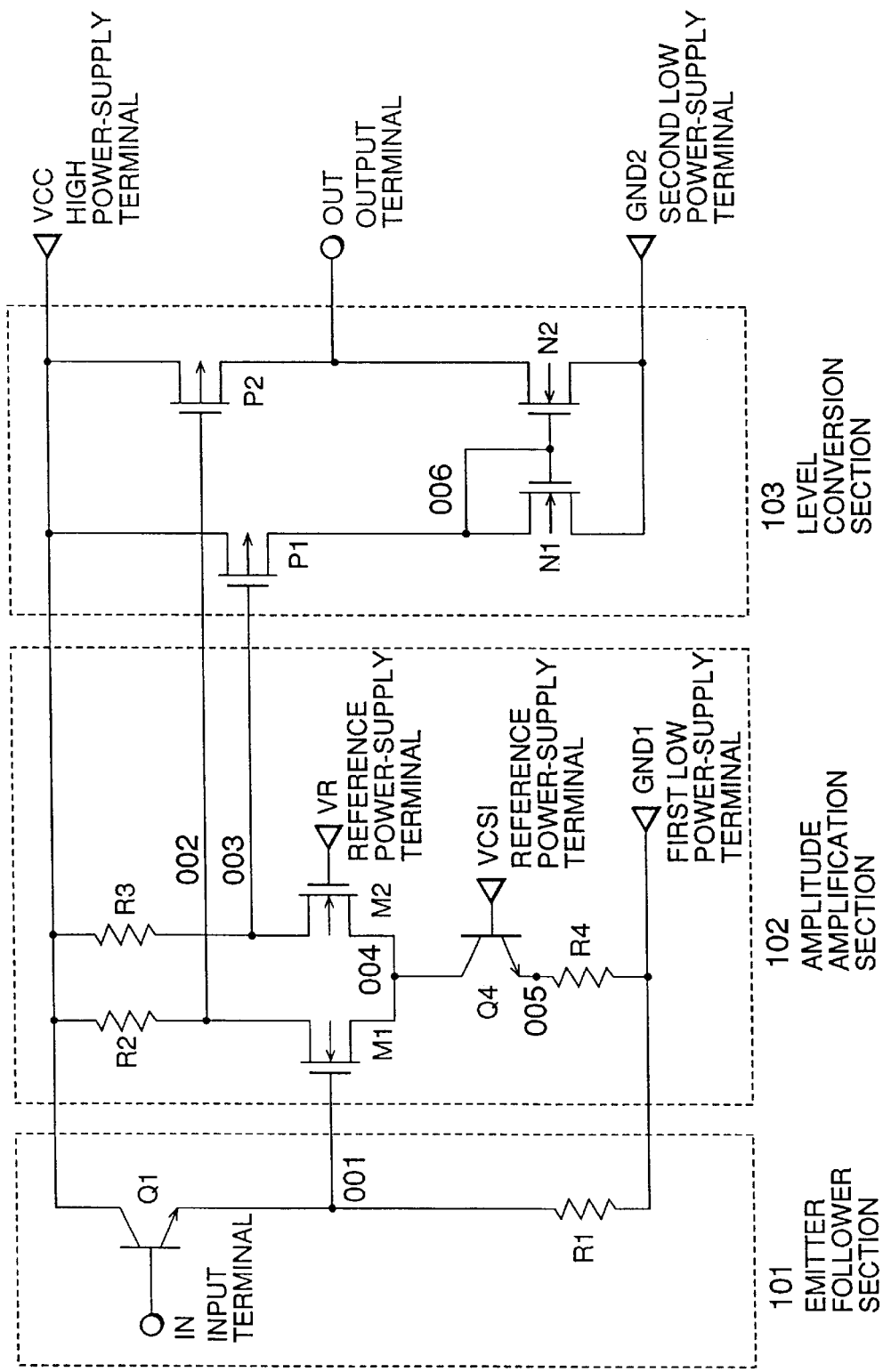
FIG. 1 is a circuit diagram showing an embodiment of a level conversion circuit of the present invention.
Figure 2:
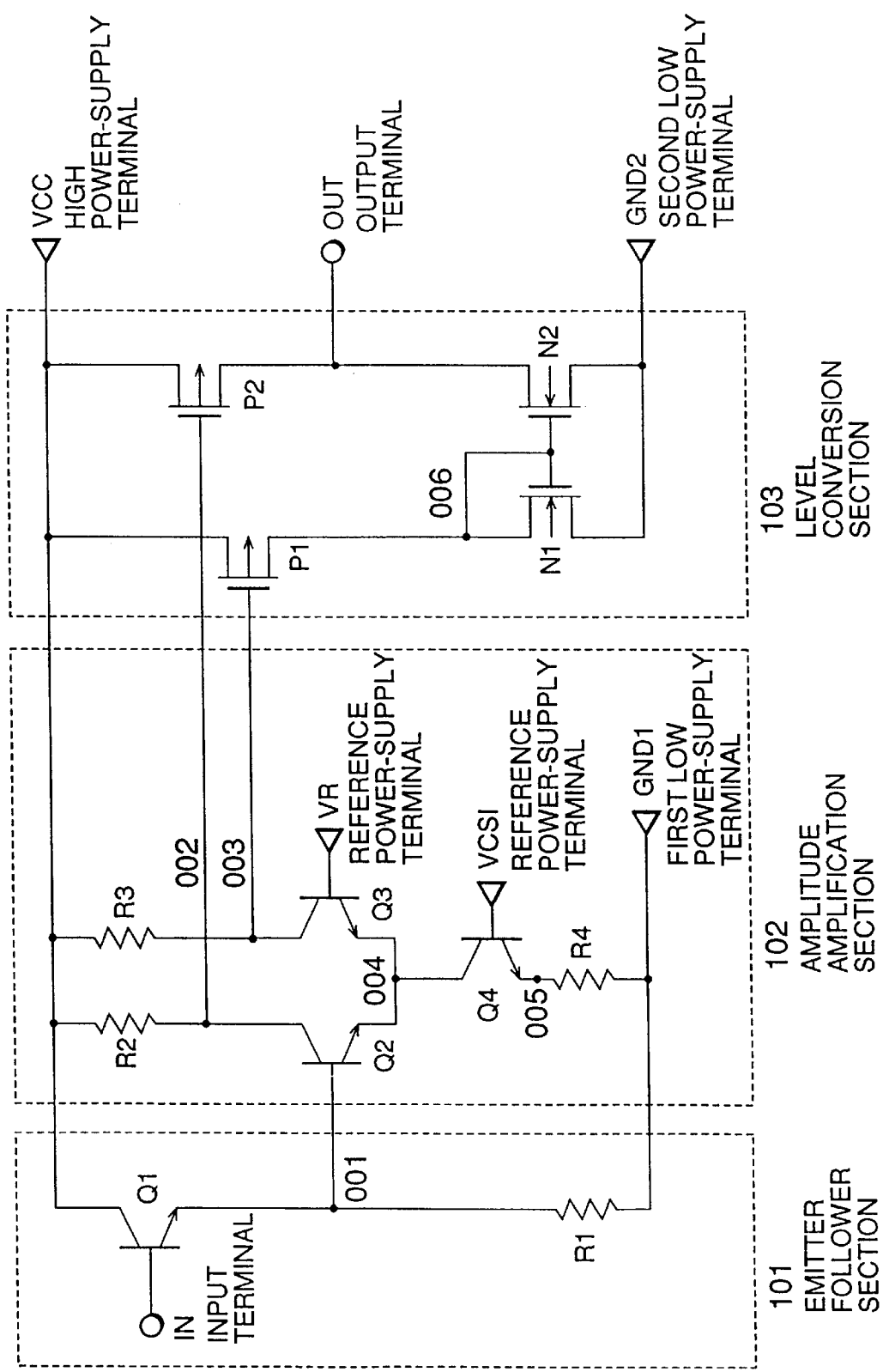
FIG. 2 is a circuit diagram showing an example of a conventional level conversion circuit.

Referring now to FIG. 1, a level conversion circuit according to an embodiment of the present invention includes an emitter follower section 101, an amplitude amplification section 102, and a level conversion section 103. The emitter follower section 101 is an emitter follower constructed such that the base of an NPN transistor Q1 is connected to an input terminal IN, the collector is connected to a high power-supply terminal VCC, and the connection node 001 of the emitter is connected to a first low power-supply terminal GND1 through a resistor R1.

The amplitude amplification section 102 is a differential amplifier constructed such that the gate of an N-channel MOS transistor M1 is connected to the node 001, the connection node 002 of the drain is connected to the high power-supply terminal VCC through a resister R2, and the source is connected to a node 004. The gate of an N-channel MOS transistor M2 is connected to a reference power-supply terminal VR, the connection node 003 of the drain is connected to the high power-supply terminal VCC through a resistor R3, and the source is connected to a node 004. The base of an NPN transistor Q4 is connected to a reference power-supply terminal VCSI, the collector is connected to the node 004, and the emitter is connected to the first low power-supply terminal GND1 through a resistor R4.

The level conversion section 103 is a level conversion section constructed such that the gate of a P-channel MOS transistor P1 is connected to the node 003, the source is connected to the high power-supply terminal VCC, and the drain is connected to a node 006. The gate of a P-channel MOS transistor P2 is connected to the node 002, the source is connected to the high power-supply terminal VCC, and the drain is connected to an output terminal OUT, The gate and drain of an N-channel MOS transistor N1 are connected to a node 006, and the source is connected to a second low power-supply terminal GND2. The gate of an N-channel MOS transistor N2 is connected to the node 006, the source is connected to the second low power-supply terminal GND2, and the drain is connected to the output terminal OUT.

In operation, when the high level of the same current mode logic (CML) level as the high power-supply potential is input to the input terminal IN, the level of the signal is shifted by the amount of the ON-state base-emitter voltage of the NPN transistor by the emitter follower section 101. The shifted signal is input to the node 001 which is the input of the amplitude amplification section 102, and the N-channel MOS transistor M1 is turned on. The N-channel MOS transistor M2 is turned off and current flows through the resistor R2. A level lower by the amount of the voltage drop of the resistor than the high power-supply potential is output to the node 002, and the high power-supply potential is output to the node 003. These levels are input to the level conversion section 103. The P-channel MOS transistor P2 is turned on and the P-channel MOS transistor P1 is turned off. The electric charges on the node 006 are pulled out by the N-channel MOS transistor N1, and the N-channel MOS transistor N2 is turned off. The high level of the same CMOS level as the high power supply potential is output to the output terminal OUT.

When the low level of the CML level lower by the amount of a logic amplitude than the high power-supply potential is input to the input terminal IN, the low level of the same CMOS level as the second low power-supply potential is output to the output terminal OUT.

In the level conversion circuit of the embodiment of the present invention, MOS transistors are used in the transistors which constitute the current switches of the amplitude amplification section, Therefore, in the case where an output level is set to a sufficiently low value so that the input transistors P1 and P2 of the level conversion section 103 can be completely turned on or off when the low level on the output of the amplitude amplification section 102 fluctuates and assumes the highest value, the output level can be set to a sufficiently low value without causing a reduction in an operating speed which is caused due to saturation, unlike bipolar transistors, even when the low level on the output fluctuates conversely in the lowest direction, and consequently-the high-speed operation of the level conversion section 103 also becomes possible. Because a low level can be output at the logic amplitude section without reducing the level of an input signal, it is possible to operate the NPN transistor of the current source without saturating it even at a low voltage.

As has been described above, the level conversion circuit according to the present invention constitutes the current switches of the differential amplifier, which is the amplitude amplification section, by MOS transistors, whereby there is no reduction in the speed which is caused by the saturation of the current switches resulting from a fluctuation in the output level in the amplitude amplification section and the output level can be set so as to be sufficiently low. Accordingly, there is the advantage that high-speed operation is made possible even when power-supply voltage is reduced.

While the invention has been described with reference to a preferred embodiment thereof, the invention is not to be limited to the details given herein, but may be modified within the scope of the appended claim.

What is claimed is:

1. A level conversion circuit comprising:

a first bipolar transistor having a base supplied with a first reference voltage;

a first resistor having a first end connected to a first potential line and a second end connected to the emitter of said first bipolar transistor;

a second resistor having a first end connected to a second potential line and a second end;

a third resistor having a first end connected to said second potential line and a second end;

a first MOS transistor of a first channel type having a gate coupled to an input terminal, a source coupled to the collector of said first bipolar transistor and a drain coupled to the second end of said second resistor;

a second MOS transistor of said first channel type having a gate supplied with a second reference voltage, a source coupled to the collector of said first bipolar transistor and a drain coupled to the second end of said third resistor;

a third MOS transistor of a second channel type having a gate directly connected to the drain of said first MOS transistor, a source coupled to said second potential line and a drain;

a fourth MOS transistor of said second channel type having a gate directly connected to the drain of said second MOS transistor, a source coupled to said second potential line and a drain;

a fifth MOS transistor of said first channel type having a gate coupled to the drain of said fourth MOS transistor, a drain coupled to the drain of said fourth MOS transistor and a source coupled to a third potential line;

a sixth MOS transistor of said first channel type having a gate coupled to the gate of said fifth MOS transistor, a drain coupled to the drain of said third MOS transistor and a source coupled to said third potential line; and an output terminal coupled to the drain of said third MOS transistor.

2. The circuit as claimed in claim 1, wherein said first channel type is an N channel type and said second channel type is a P channel type.

3. A level conversion circuit for converting an ECL or CML level signal to a MOS level signal, comprising:

an emitter follower section for receiving said ECL or CML level signal and outputting a level-shifted signal;

a differential amplitude amplification section provided with a pair of N-channel MOS transistors, their sources being connected in common a current source comprises a first bipolar transistor and a first resistor connected in series, said first bipolar transistor having a collector connected to said sources of said pair of N-channel MOS transistors, said first resistor having one end connected to an emitter of said first bipolar transistor and another end connected to a first low power-supply terminal, an output of said emitter follower section being input to the gate of one transistor of said pair of N-channel MOS transistors, a complementary signal of the output of said emitter follower section or an input reference voltage being input to the gate of the other transistor, their drains being connected to one end of second and third resistors, respectively and another end of said second and third resistors being connected to a high power-supply terminal, respectively; and a level conversion section provided with a pair of P-channel MOS transistors where their sources are connected to said high power-supply terminal and their gates receive a differential output of said amplitude amplification section and a current mirror circuit which comprises a pair of N-channel MOS transistors where their drains are respectively connected to the drains of said P-channel MOS transistors, the sources of the N-channel MOS transistors being connected to a second low power-supply terminal, the gates of the N-channel MOS transistors being connected in common and also being connected to one drain of the N-channel MOS transistors, and the other drain being output.

4. The circuit as claimed in claim 1, wherein a second bipolar transistor has a base receiving an ECL or CML level signal, a collector connected to said second potential line and an emitter connected to said first potential line through a fourth resistor, said base of said second bipolar transistor being connected to an input terminal.

5. The circuit as claimed in claim 3, wherein said emitter follower section comprises a second bipolar transistor having a collector connected to said high power-supply terminal, an emitter connected to said gate of one transistor of said pair of N-channel MOS transistors of said differential amplitude amplification section and a base which receives said ECL or CML level signal, and a fourth resistor having one end connected to said emitter of said second bipolar transistor and another end connected to said first low power-supply terminal.

6. The circuit as claimed in claim 4, wherein said first channel is an N-channel type, said second channel type being a P-channel type, and each of said first and second bipolar transistors is of an NPN type.

* * * * *